(12) United States Patent  
Nishiguchi

(10) Patent No.: US 10,770,009 B2  
(45) Date of Patent: Sep. 8, 2020

(54) DISPLAY DEVICE

(71) Applicant: SHARP KABUSHIKI KAISHA, Sakai, Osaka (JP)

(72) Inventor: Takenobu Nishiguchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 372 days.

(21) Appl. No.: 15/774,507

(22) PCT Filed: Nov. 2, 2016

(86) PCT No.: PCT/JP2016/082551  
§ 371 (c)(1),  
(2) Date: May 8, 2018

(87) PCT Pub. No.: WO2017/082129  
PCT Pub. Date: May 18, 2017

(65) Prior Publication Data  
US 2020/0251061 A1    Aug. 6, 2020

(30) Foreign Application Priority Data  
Nov. 9, 2015   (JP) ................. 2015-219265

(51) Int. Cl.  
*G09G 3/36*     (2006.01)  
*G09G 3/3208*   (2016.01)  
(Continued)

(52) U.S. Cl.  
CPC ..... *G09G 3/3607* (2013.01); *G02F 1/133603* (2013.01); *G09G 3/3208* (2013.01);  
(Continued)

(58) Field of Classification Search  
CPC ............... G09G 3/3607; G09G 3/3208; G09G 2310/08; G09G 2370/08; G02F 1/133603; H01L 27/1225; H05B 33/08  
See application file for complete search history.

(56) References Cited

U.S. PATENT DOCUMENTS 5,909,219 A * 6/1999 Dye ..................... G06T 3/4015  
                                                345/553  
6,189,064 B1 * 2/2001 MacInnis ................. G06T 9/00  
                                                345/440  
(Continued)

FOREIGN PATENT DOCUMENTS

JP    2014-066928 A    4/2014

*Primary Examiner* — Ryan A Lubit  
(74) *Attorney, Agent, or Firm* — ScienBiziP, P.C.

(57) ABSTRACT

When transparency information (T) is externally inputted along with RGB image data (DV1), the RGB image data (DV1) is converted to YUV image data (DV2) in YUV422 format, and the transparency information (T) is added to information about a color-difference component U or V therein, thereby generating YUV image data (DV3) to be inputted to a signal processing portion (20). The signal processing portion 20 extracts the transparency information (T) and converts the YUV image data (DV2) to RGB image data (DV1). When the RGB image data (DV1) and the transparency information (T) are inputted to an LCD timing controller (30), the LCD timing controller 30 renders a liquid crystal display panel (90) transparent on the basis of the transparency information (T), thereby allowing background light to be transmitted therethrough, or when only the RGB image data (DV1) is inputted, the liquid crystal display panel (90) displays an image.

14 Claims, 19 Drawing Sheets

(51) Int. Cl.
*H05B 33/08* (2020.01)
*H01L 27/12* (2006.01)
*G02F 1/13357* (2006.01)

(52) U.S. Cl.
CPC ......... *H01L 27/1225* (2013.01); *H05B 33/08* (2013.01); *G09G 2310/08* (2013.01); *G09G 2370/08* (2013.01)

(56) References Cited

U.S. PATENT DOCUMENTS

| | | | |
|---|---|---|---|
| 9,953,591 B1* | 4/2018 | Holland | G09G 3/3607 |
| 2002/0097339 A1* | 7/2002 | Kwon | H04N 5/44504 |
| | | | 348/569 |
| 2007/0263937 A1* | 11/2007 | Rizko | H04N 19/63 |
| | | | 382/232 |
| 2013/0169705 A1* | 7/2013 | Kobayashi | G06T 5/20 |
| | | | 345/694 |
| 2016/0163250 A1* | 6/2016 | Ohishi | G09G 5/10 |
| | | | 345/604 |

* cited by examiner

| 1ST PIXEL | 2ND PIXEL | 3RD PIXEL | 4TH PIXEL | 5TH PIXEL | 6TH PIXEL |
|---|---|---|---|---|---|
| R0 | R1 | R2 | R3 | R4 | R5 |
| G0 | G1 | G2 | G3 | G4 | G5 |
| B0 | B1 | B2 | B3 | B4 | B5 |

FIG. 3

| 1ST PIXEL | 2ND PIXEL | 3RD PIXEL | 4TH PIXEL | 5TH PIXEL | 6TH PIXEL |
|---|---|---|---|---|---|
| Y0 | Y1 | Y2 | Y3 | Y4 | Y5 |
| Cb0 || Cb2 || Cb4 ||
| Cr0 || Cr2 || Cr4 ||

FIG. 4

| 1ST PIXEL | 2ND PIXEL | 3RD PIXEL | 4TH PIXEL | 5TH PIXEL | 6TH PIXEL |
|---|---|---|---|---|---|
| Y0 | Y1 | Y2 | Y3 | Y4 | Y5 |
| Cb0 | T0 | Cb2 | T2 | Cb4 | T4 |
| Cr0 | T1 | Cr2 | T3 | Cr4 | T5 |

| 1ST PIXEL | 2ND PIXEL | 3RD PIXEL | 4TH PIXEL | 5TH PIXEL | 6TH PIXEL |
|---|---|---|---|---|---|
| T0 | T1 | T2 | T3 | T4 | T5 |

| 1ST PIXEL | 2ND PIXEL | 3RD PIXEL | 4TH PIXEL | 5TH PIXEL | 6TH PIXEL |
|---|---|---|---|---|---|
| Y0 | Y1 | Y2 | Y3 | Y4 | Y5 |
| Cb0 || Cb2 || Cb4 ||
| Cr0 || Cr2 || Cr4 ||

FIG. 11

| 1ST PIXEL | 2ND PIXEL | 3RD PIXEL | 4TH PIXEL | 5TH PIXEL | 6TH PIXEL |
|---|---|---|---|---|---|
| Y0 | Y1 | Y2 | Y3 | Y4 | Y5 |
| Cb0 | T1 | Cb2 | T3 | Cb4 | T5 |
| Cr0 | T1 | Cr2 | T3 | Cr4 | T5 |

FIG. 12

| 1ST PIXEL | 2ND PIXEL | 3RD PIXEL | 4TH PIXEL | 5TH PIXEL | 6TH PIXEL |
|---|---|---|---|---|---|
| Y0 | Y1 | Y2 | Y3 | Y4 | Y5 |
| Cb0 | T1 | Cb2 | T3 | Cb4 | T5 |
| Cr0 | — | Cr2 | — | Cr4 | — |

FIG. 13

| 1ST PIXEL | 2ND PIXEL | 3RD PIXEL | 4TH PIXEL | 5TH PIXEL | 6TH PIXEL |
|---|---|---|---|---|---|
| Y0 | Y1 | Y2 | Y3 | Y4 | Y5 |
| Cb0 | T0+BL | Cb2 | T2 | Cr4 | T4 |
| Cr0 | T1+BL | Cr2 | T3 | Cr4 | T5 |

FIG. 14

| 1ST PIXEL | 2ND PIXEL | 3RD PIXEL | 4TH PIXEL | 5TH PIXEL | 6TH PIXEL |
|---|---|---|---|---|---|
| T0 | T1 | T2 | T3 | T4 | T5 |

+

| 1ST PIXEL | 2ND PIXEL | 3RD PIXEL | 4TH PIXEL | 5TH PIXEL | 6TH PIXEL |
|---|---|---|---|---|---|
| BL | BL | — | — | — | — |

+

| 1ST PIXEL | 2ND PIXEL | 3RD PIXEL | 4TH PIXEL | 5TH PIXEL | 6TH PIXEL |
|---|---|---|---|---|---|
| Y0 | Y1 | Y2 | Y3 | Y4 | Y5 |
| Cb0 | | Cb2 | | Cb4 | |
| Cr0 | | Cr2 | | Cr4 | | ized
DISPLAY DEVICE

TECHNICAL FIELD

The present invention relates to display devices, particularly to a see-through display device capable of displaying an image by field-sequential drive while achieving transparency to allow a background to be seen therethrough.

BACKGROUND ART

In recent years, field-sequential drive has been drawing attention as a method for driving a liquid crystal display device that displays a color image. In typical field-sequential drive, one frame for displaying one screen is divided into three fields, and red, green, and blue LEDs (light-emitting diodes), which constitute a backlight source, are sequentially switched around and lit up for their respective fields. In synchronization with the lighting of the LEDs, data voltages, which are generated on the basis of image data corresponding to the colors of the light, are sequentially applied to a liquid crystal display panel, thereby controlling the transmission state thereof, such that additive color mixing takes place on the retina of the viewer. As a result, the field-sequential drive, unlike drive using color filters, renders it possible to display a color image without a plurality of subpixels formed in each pixel, thereby achieving higher resolution. Moreover, it is not necessary to provide color filters, which have a high level of backlight absorption, resulting in enhanced light use efficiency of the LEDs.

To enable such a liquid crystal display device to be used also as a see-through display device allowing a background to be seen, there is a method in which some values for color depth levels are allocated to transparency range. For example, in the case where data for an image in each color included in image data is 8-bit image data, a color image is displayed by representing red (R), green (G), and blue (B) images with 255 levels from 0 to 254, rather than 256 levels from 0 to 255, and the pixel value (255, 255, 255) is used for see-through display. Thus, the liquid crystal display device renders it possible to achieve not only color image display but also transparency to allow a background to be seen therethrough.

Furthermore, in the case of a liquid crystal display device which displays an image based on image data which includes display image data for image display and lighting-pattern image data for controlling the pattern of lighting up a backlight, the size of the display image data is small, which results in image deterioration. Therefore, in the case of a liquid crystal display device described in Patent Document 1, the display image data and the lighting-pattern image data are provided in a time division manner in order to keep the size of the display image data from becoming small and thereby preventing image deterioration.

CITATION LIST

Patent Document

Patent Document 1: Japanese Laid-Open Patent Publication No. 2014-66928

SUMMARY OF THE INVENTION

Problems to be Solved by the Invention

However, in the case of such a liquid crystal display device with a specific pixel value allocated for see-through display, although see-through display is possible, the color that is to be assigned to that pixel value cannot be displayed. For example, when the pixel value (255, 255, 255) is allocated for see-through display, the liquid crystal display device cannot display white, which should be displayed with that pixel value.

Furthermore, in the case of the liquid crystal display device described in Patent Document 1, the display image data and the lighting-pattern image data have to be provided in a time division manner, and therefore, the drive of the liquid crystal display device becomes complex.

Therefore, an objective of the present invention is to provide a display device capable of displaying a color image using all colors by means of field-sequential drive while achieving see-through display.

Solution to the Problems

A first aspect of the present invention is directed to a liquid crystal display device for displaying a color image by separating a frame consisting of a plurality of fields into the individual fields and displaying an image in a different color for each field, the device comprising:

a display panel including a plurality of pixel circuits capable of display in a transparent display mode, the pixel circuits being arranged in a matrix;

a driver circuit configured to drive the pixel circuits;

an image timing control portion configured to control a time to output a plurality of pieces of color image data included in input image data in an RGB format to the driver circuit, each piece of the color image data representing an image in a different color;

a signal source configured to convert externally provided input image data to YUV image data in YUV422 format and, when transparency information by which the display panel is caused to be transparent, is inputted as well, generate transparency YUV image data by adding the transparency information to information about color-difference components in the YUV image data; and a signal processing portion configured to, when the transparency information is added, extract the transparency information from the transparency YUV image data and convert the YUV image data remaining after the extraction of the transparency information to RGB image data in the RGB format, or when the transparency information is not added, convert the YUV image data to image data in the RGB format and output both the transparency information and the RGB image data, or only the RGB image data, to the image timing control portion on a field by field basis, wherein, the image timing control portion, when provided with the transparency information and the RGB image data, causes the display panel to be transparent so as to transmit background light, on the basis of the transparency information, or when provided with only the RGB image data, displays an image.

In a second aspect of the present invention, based on the first aspect of the present invention, wherein the transparency information is added to information about two color-difference components in the YUV image data for every other pixel, such that the transparency information added for a first of the two color-difference components and the transparency information added for a second of the two color-difference components are respectively for different pixels.

In a third aspect of the present invention, based on the second aspect of the present invention, wherein the transparency information added for the first color-difference component and the transparency information added for the second color-difference component are different information.

In a forth aspect of the present invention, based on the second aspect of the present invention, wherein the transparency information added for the first color-difference component and the transparency information added for the second color-difference component are identical information.

In a fifth aspect of the present invention, based on the first aspect of the present invention, wherein the transparency information is added to information about only one of two color-difference components in the YUV image data for every other pixel, such that the transparency information added for the color-difference component is related to different pixels.

In a sixth aspect of the present invention, based on the first aspect of the present invention, wherein,
the display panel is a liquid crystal display panel,
the display device further comprises:
a backlight source disposed on a back of the liquid crystal display panel and including a plurality of light-emitting elements irradiating the liquid crystal display panel with light in a color corresponding to color image data included in the input image data for each of the fields; and
a light source timing control portion configured to, when light source information is externally inputted or internally generated, generate and output a light-emitting element control signal to the backlight source in order to provide control over turning on or off the light-emitting elements in accordance with the light source information, and
the light source timing control portion, when the input image data is externally provided, irradiates the liquid crystal display panel with backlight in a plurality of colors outputted by the backlight source in a time division manner, or when the transparency information is inputted along with the input image data, turns off the light-emitting elements.

In a seventh aspect of the present invention, based on the sixth aspect of the present invention, wherein the light-emitting elements of the backlight source are arranged on a plane.

In an eighth aspect of the present invention, based on the first aspect of the present invention, wherein,
the display panel is an organic EL panel on which a plurality of pixel circuits are disposed, each pixel circuit including a light-emitting element irradiating the organic EL panel with light in a color corresponding to color image data included in the input image data for each of the fields,
the display device further comprises a light source timing control portion configured to, when light source information is externally inputted or internally generated, generate and output a light-emitting element control signal to the organic EL panel in order to provide control over turning on or off the light-emitting elements in accordance with the light source information, and
the light source timing control portion, when the input image data is externally provided, causes the light-emitting elements to emit light sequentially in colors corresponding to the color image data in a time division manner, in accordance with the light-emitting element control signal, or when the transparency information is inputted along with the input image data, turns off the light-emitting elements.

In a ninth aspect of the present invention, based on the sixth aspect of the present invention, wherein the light source information is provided only for first pixels in the input image data that have been provided with the transparency information.

In a tenth aspect of the present invention, based on the sixth aspect of the present invention, wherein the light source information is information represented by a plurality of bits for each color of light to be emitted, and causes the light-emitting elements to emit light simultaneously for display in the transparent display mode.

In an eleventh aspect of the present invention, based on the sixth aspect of the present invention, wherein,
when the light source information is externally inputted along with the input image data, the signal source generates transparency/backlight YUV image data by further adding the light source information to the YUV image data in order to control the light-emitting elements, and
the signal processing portion extracts the light source information from the transparency/backlight YUV image data, along with the transparency information, converts the YUV image data remaining after the extraction of the transparency information and the light source information, to the RGB image data, and outputs the light source information and the RGB image data to the image timing control portion.

In a twelfth aspect of the present invention, based on the eleventh aspect of the present invention, wherein the signal processing portion further generates light source information for a white field provided to simultaneously light up all of the light-emitting elements, in addition to color image data corresponding to the white field, and outputs the light source information to the light source timing control portion and the color image data to the image timing control portion.

In a thirteenth aspect of the present invention, based on the first aspect of the present invention, wherein the pixel circuit includes a thin-film transistor with an oxide semiconductor layer.

In a fourteenth aspect of the present invention, based on the thirteenth aspect of the present invention, wherein the oxide semiconductor layer is formed with indium gallium zinc oxide.

Effect of the Invention

In the first aspect, when the transparency information is externally inputted along with the input image data, the input image data is converted to the YUV image data in YUV422 format, and further, the YUV pixel data is inputted to the signal processing portion after the transparency information is added to the information about the color-difference components therein. The signal processing portion extracts the transparency information, and converts the YUV image data to RGB image data. When the RGB image data and the transparency information are inputted to the image timing control portion, the image timing control portion renders the display panel transparent on the basis of the transparency information, thereby allowing background light to be transmitted therethrough, or when only the RGB image data is inputted, the display panel displays an image. Thus, the display device can display a color image using all colors by means of field-sequential drive while achieving see-through display whereby the background can be viewed.

In the second aspect, the transparency information is added to information about two color-difference components for every other pixel, such that the transparency information added for a first of the two color-difference components and the transparency information added for a second of the two color-difference components are respectively for different pixels, and therefore, two adjacent pixels can be individually controlled in terms of the state of being or not being transparent.

The third aspect renders it possible to perform control on two adjacent pixels independently of each other as to whether to render the pixels transparent.

The fourth aspect renders it possible to use transparency information for either of two adjacent pixels to control the two adjacent pixels so as to be the same in terms of the state of being or not being transparent.

In the fifth aspect, the transparency information is added to information about only one of two color-difference components, and therefore, the transparency information can be added and extracted readily.

The sixth aspect renders it possible for the liquid crystal display device to display a color image using all colors by means of field-sequential drive while achieving see-through display whereby the background can be viewed.

In the seventh aspect, the backlight source includes a plurality of light-emitting elements arranged on a plane, and by using such a backlight source, a portion of a screen with an image being displayed thereon can be rendered transparent.

The eighth aspect renders it possible for an organic EL display device to display a color image using all colors by means of field-sequential drive while achieving see-through display whereby the background can be viewed.

In the ninth aspect, the light source information is provided only for the first pixels in the input image data that have been provided with the transparency information, whereby it is rendered possible to provide control over turning on or off all light-emitting elements.

In the tenth aspect, the light source information is information represented by a plurality of bits for each color of light to be emitted, and causes the light-emitting elements to emit light simultaneously for display in the transparent display mode, whereby a wide variety of representations can be achieved.

In the eleventh aspect, the signal source adds the transparency information and the light source information to YUV image data resulting from conversion, and the signal processing portion extracts these pieces of information from the YUV image data, and converts the YUV image data remaining after the extraction to RGB image data. As a result, the transparency information, the light source information, and the RGB image data can all be utilized. Thus, it is possible to display a color image using all colors while achieving see-through display whereby the background can be viewed.

In the twelfth aspect, in addition to fields for lighting up the red, green, and blue LEDs sequentially in a time division manner, a white field for lighting up these LEDs simultaneously is provided, whereby it is possible to prevent the occurrence of color breakup to be seen when the viewer changes his/her line of sight.

In the thirteenth and fourteenth aspects, the thin-film transistor has an oxide semiconductor layer, and by using such a thin-film transistor, the display panel can be driven at high speed, whereby an image can be displayed by field-sequential drive.

BRIEF DESCRIPTION OF THE DRAWINGS

FIG. 3 is a table showing the configuration of YUV image data for the first through sixth pixels shown in FIG. 2.

FIG. 4 is a table showing the configuration of transparency YUV image data resulting from transparency information being added to the YUV image data shown in FIG. 3.

FIG. 11 is a table showing the configuration of a first variant of the transparency YUV image data in the first embodiment.

FIG. 12 is a table showing the configuration of a second variant of the transparency YUV image data in the first embodiment.

FIG. 13 is a table showing the configuration of transparency/backlight YUV image data resulting from addition of transparency information and backlight information in a second embodiment of the present invention.

FIG. 14 is a diagram showing the configurations of transparency information and backlight information extracted from the transparency/backlight YUV image data shown in FIG. 13, along with the configuration of YUV image data after the extraction.

MODES FOR CARRYING OUT THE INVENTION

1. First Embodiment

Before describing the configuration and the operation of a liquid crystal display device according to a first embodiment of the present invention, format conversion to be performed on image data in the present embodiment will be described.

1.1 Image Data Format Conversion

A digital color image is displayed on a liquid crystal display panel with a plurality of pixels arranged in a matrix. The digital color image can be displayed using either image data containing a combination of red (R), green (G), and blue image data (hereinafter the entire image data being referred to as "RGB image data", and the combination being referred to as "RGB format") or image data containing a combination of information about luminance Y and information about color-difference components U and V (hereinafter the entire image data being referred to as "YUV image data", and the combination being referred to as "YUV format"). An example of such image data subjected to a color space conversion from RGB format to YUV format is image data in YUV444 format, which is designed to not reduce the amount of information about luminance Y and color-difference components U and V. Moreover, another example is image data in YUV422 format, which takes advantage of the human's visual characteristic of being less sensitive to chrominance than to luminance and is designed to halve the amount of information about color-difference components U and V in the horizontal direction by sampling, without changing the amount of information about luminance Y, and still another example is image data in YUV420 format, which is designed to achieve the above, and in addition, halve the amount of information about color-difference components U and V in the vertical direction by sampling. Note that the RGB image data will also be referred to as the "input image data".

Figures 1, 2:
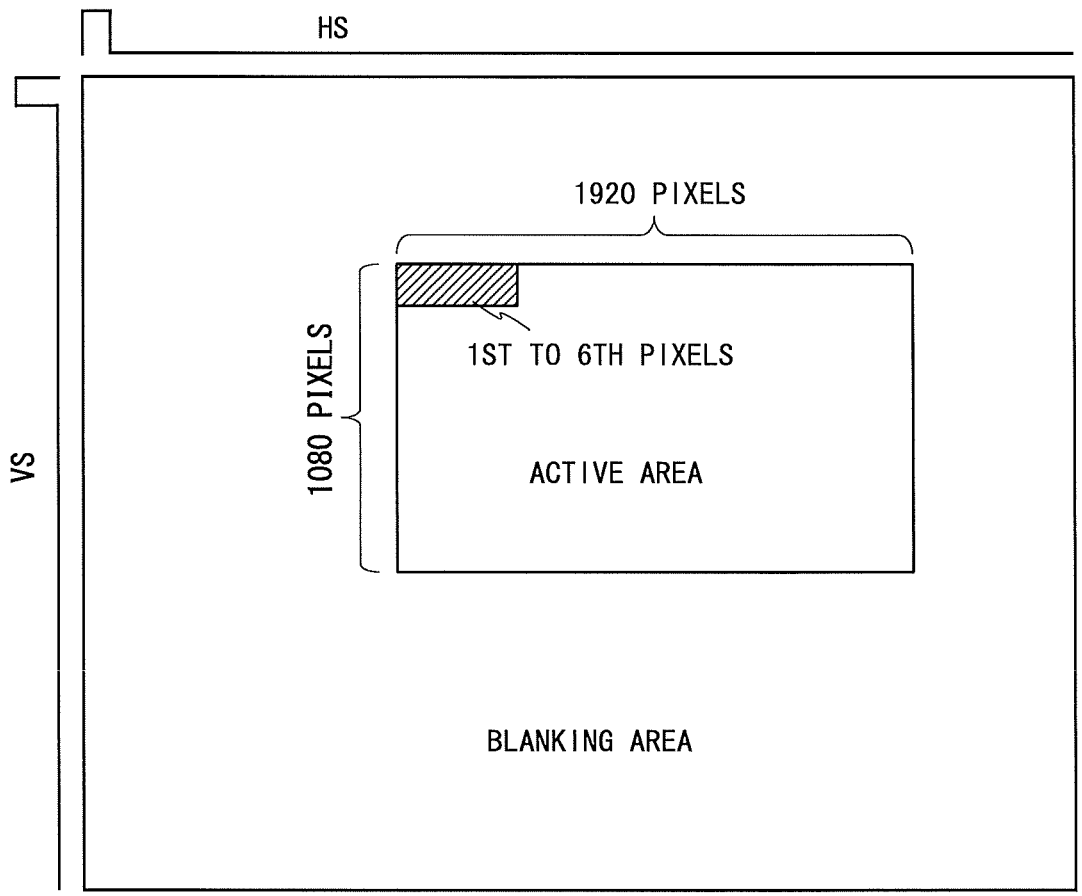
FIG. 1 is a diagram illustrating an area for one frame period in a first embodiment of the present invention.
FIG. 2 is a table showing the configuration of RGB image data externally provided to display an image by six pixels in a top-left corner area in FIG. 1.

FIG. 1 is a diagram representing an area for one frame period in the present embodiment. As shown in FIG. 1, the area for one frame period is defined by a horizontal synchronization signal HS and a vertical synchronization signal VS, and includes an active area in which to display an image and a blanking area positioned so as to surround the active area. In the active area, pixels are arranged in a matrix, for example, where each horizontal row includes 1920 pixels and each vertical column includes 1080 pixels. The present invention utilizes the active area.

In the present embodiment, image data is converted from RGB format to YUV422 format. Then, transparency information is added to the YUV image data, whereby it is rendered possible to not only display an image represented by all colors but also achieve see-through display. Accordingly, image data conversion required for achieving such see-through display will be described focusing on six pixels shown in FIG. 1.

FIG. 2 is a table showing the configuration of RGB image data externally provided to display an image by six pixels in a top-left corner area in FIG. 1. As shown in FIG. 2, the RGB image data for each of the first through sixth pixels is composed of red image data R, green image data G, and blue image data B.

The RGB image data is initially converted to YUV image data in YUV422 format. FIG. 3 is a table showing the configuration of the YUV image data for the first through sixth pixels. As shown in FIG. 3, after the conversion of the RGB image data to the YUV image data, luminances Y for the pixels are respectively represented by Y0, Y1, Y2, Y3, Y4, and Y5, and the color-difference components U and V are the same for each pair of pixels. More specifically, for the first and second pixels, the color-difference component U is Cb0, and the color-difference component V is Cr0. For the third and fourth pixels, the color-difference component U is Cb2, and the color-difference component V is Cr2. For the fifth and sixth pixels, the color-difference component U is Cb4, and the color-difference component V is Cr4.

Next, for every other pixel, transparency information T, which indicates whether the pixel is transparent, is added in place of the color-difference components U and V. FIG. 4 is a table showing the configuration of YUV image data DV3 (hereinafter referred to as "transparency YUV image data DV3") in YUV422 format resulting from the transparency information being added to the YUV image data DV2 shown in FIG. 3. As shown in FIG. 4, for the second pixel, the color-difference component U, which is Cb0, and the color-difference component V, which is Cr0, are respectively replaced by transparency information T0 and transparency information T1. Similarly, for the fourth pixel, the color-difference component U, which is Cb2, and the color-difference component V, which is Cr2, are respectively replaced by transparency information T2 and transparency information T3, and for the sixth pixel, the color-difference component U, which is Cb4, and the color-difference component V, which is Cr4, are respectively replaced by transparency information T4 and transparency information T5. As a result, the transparency YUV image data is generated.

Figure 5:
FIG. 5 is a diagram showing the configuration of transparency information extracted from the transparency YUV image data shown in FIG. 4, and the configuration of YUV image data remaining after the extraction of the transparency information.

Next, the transparency information is extracted from the transparency YUV image data. FIG. 5 is a diagram showing the configuration of the transparency information T extracted from the transparency YUV image data shown in FIG. 4, and the configuration of the YUV image data remaining after the extraction of the transparency information T. As shown in FIG. 5, the pieces of transparency information T1 to T6 extracted from the transparency YUV image data are transparency information for the first through sixth pixels, respectively. Moreover, the transparency YUV image data after the extraction of the pieces of transparency information T1 to T6 is converted to YUV image data. More specifically, for the first and second pixels, the color-difference component U becomes Cb0, and the color-difference component V becomes Cr0. Similarly, for the third and fourth pixels, the color-difference component u becomes Cb2, and the color-difference component V becomes Cr2; for the fifth and sixth, the color-difference component U becomes Cb4, and the color-difference component V becomes Cr4.

The transparency information T0 and the transparency information T1 thus extracted from information about the second pixel in the YUV image data respectively render the first and second pixels in a transparent state. Similarly, the transparency information T4 and the transparency information T5 extracted from information about the fifth pixel render the fifth and sixth pixels in a transparent state. As a result, all of the first through sixth pixels are rendered transparent, with the result that the viewer can see the background of the liquid crystal display device through these pixels.

Figure 6:
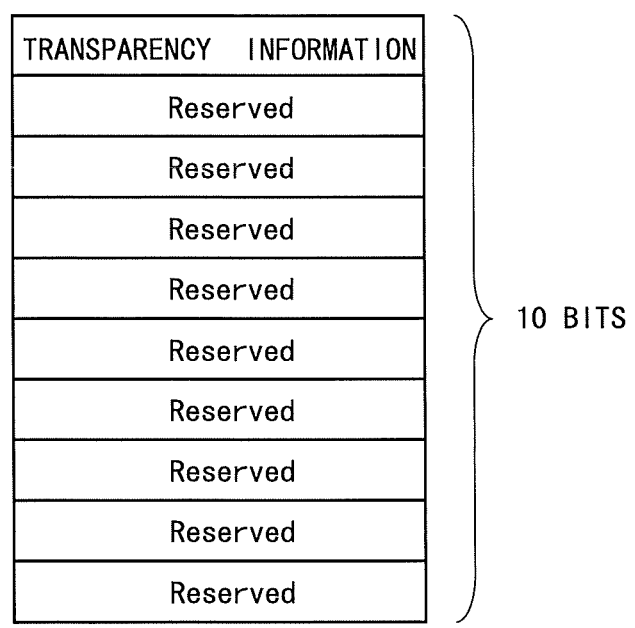
FIG. 6 is a diagram showing an example bit configuration of an additional information storage region provided for a color-difference component for one pixel in the transparency YUV image data shown in FIG. 4.

For each of the luminance Y and the color-difference components U and V, the YUV image data has a 10-bit additional information storage region provided on a pixel by pixel basis in order to store additional information. On the other hand, the transparency information is information representing whether the pixel is in a see-through state, and therefore, can be expressed by 1-bit data. FIG. 6 is a diagram showing an example bit configuration of the additional information storage region provided for the color-difference component U in the transparency YUV image data for one pixel. As shown in FIG. 6, the additional information storage region provided for the color-difference component U for the pixel, for which the transparency information is added, consists of ten bits, one of which being used to store the transparency information, and the remaining nine bits being reserved for backups.

The foregoing has been given regarding the image data format conversion required for rendering the screen transparent by externally providing the transparency information. However, in the case where an image is displayed, no transparency information is provided, and only the image data is provided. Accordingly, the image data format conversion required for image display will now be described.

Once the RGB image data shown in FIG. 2 is externally provided to the pixels by which to display an image, the RGB image data is converted to the YUV image data in YUV422 format shown in FIG. 3. In this case, transparency information T is not provided and therefore is not added to the YUV image data. Accordingly, the YUV image data is converted back to the original RGB image data shown in FIG. 2, without transparency information being extracted therefrom. In this manner, the RGB image data is provided to all of the first through sixth pixels, and therefore, an image is displayed by all of the pixels and can be seen by the viewer.

<1.2 Configuration and Operation of the Liquid Crystal Display Device>

Figure 7:
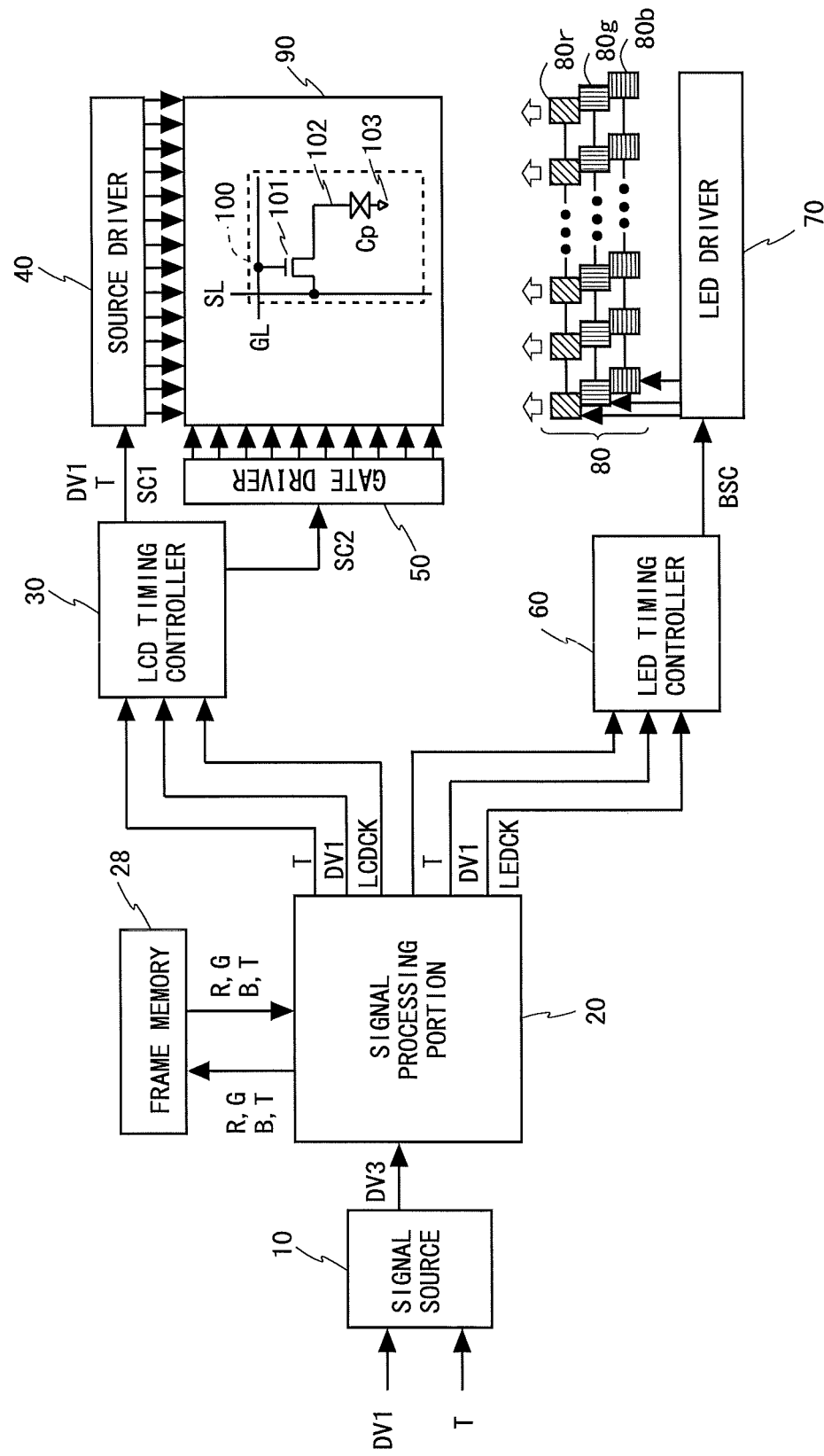
FIG. 7 is a block diagram illustrating the configuration of a liquid crystal display device according to the first embodiment of the present invention.
Figure 8:
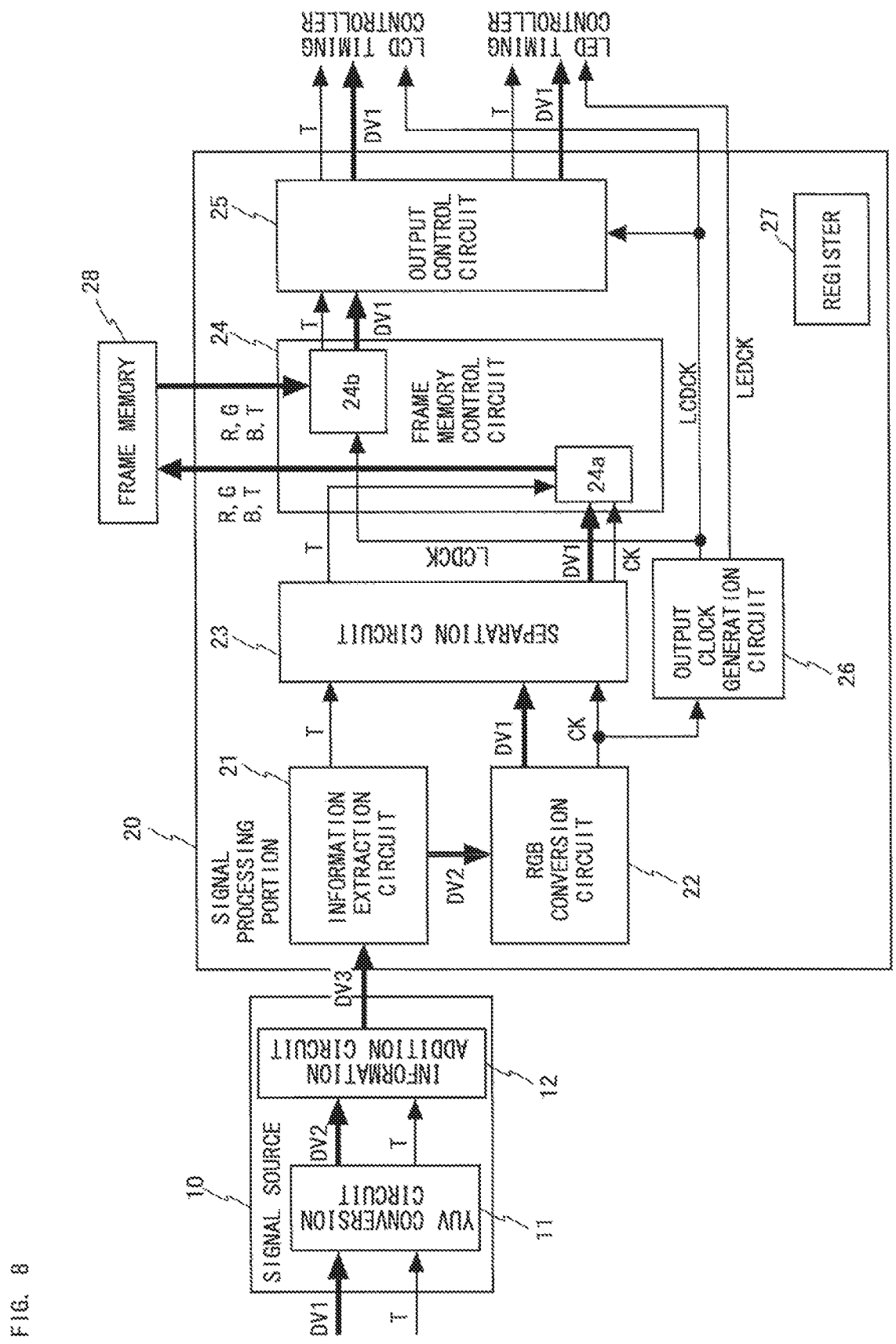
FIG. 8 is a block diagram illustrating in detail the configurations of a signal source and a signal processing portion included in the liquid crystal display device shown in FIG. 7.

FIG. 7 is a block diagram illustrating the configuration of the liquid crystal display device according to the first embodiment of the present invention, and FIG. 8 is a block diagram illustrating in detail the configurations of a signal source 10 and a signal processing portion 20 included in the liquid crystal display device shown in FIG. 7. As shown in FIG. 7, the liquid crystal display device includes the signal source 10, the signal processing portion 20, frame memory 28, an LCD timing controller 30, a source driver 40, a gate driver 50, a liquid crystal display panel 90, an LED timing controller 60, an LED driver 70, and a backlight source 80. Moreover, as shown in FIG. 8, the signal source 10 includes a YUV conversion circuit 11 and an information addition circuit 12, and the signal processing portion 20 includes an information extraction circuit 21, an RGB conversion circuit 22, a separation circuit 23, a frame memory control circuit 24, an output control circuit 25, an output clock generation circuit 26, and a register 27.

In the following descriptions about the liquid crystal display device, the signal source 10 and the signal processing portion 20 will be described with reference mainly to FIG. 8, and the other features will be described with reference mainly to FIG. 7.

As shown in FIG. 8, when the RGB image data DV1 (see FIG. 2) and the transparency information T, which indicates, for each pixel, whether the pixel is transparent, are externally provided to the YUV conversion circuit 11 in the signal source 10, the YUV conversion circuit 11 converts the RGB image data DV1 to the YUV image data DV2 in YUV422 format (see FIG. 3), and outputs the YUV image data DV2 and the transparency information T to the information addition circuit 12. The information addition circuit 12 generates the transparency YUV image data DV3 (see FIG. 4) by adding the transparency information T to the YUV image data DV2, and outputs the transparency YUV image data DV3 to the information extraction circuit 21 in the signal processing portion 20.

The information extraction circuit 21 extracts the added transparency information T from the transparency YUV image data DV3, and outputs the transparency information T to the separation circuit 23 and the YUV image data DV2 remaining after the extraction of the transparency information T (see FIG. 5) to the RGB conversion circuit 22. The YUV image data DV2 is converted to the RGB image data DV1 (see FIG. 2) by the RGB conversion circuit 22. Moreover, the RGB conversion circuit 22 generates an input clock signal CK on the basis of the RGB image data DV1, and outputs the generated signal to the separation circuit 23 and the output clock generation circuit 26.

The separation circuit 23 separates the RGB image data DV1 into red image data R, green image data G, and blue image data B, and outputs these image data to the frame memory control circuit 24, along with the transparency information T and the input clock signal CK.

The frame memory control circuit 24 includes a write circuit 24a for writing image data R, G, and B for the respective colors to the frame memory 28, and a readout circuit 24b for reading out various data from the frame memory 28. Upon provision of the image data R, G, and B for the respective colors and the transparency information T at a time determined by the input clock signal CK, the write circuit 24a writes the image data R, G, and B for the respective colors and the transparency information T sequentially to predetermined storage regions in the frame memory 28 on a pixel by pixel basis at times determined by a memory clock signal (not shown) generated in accordance with a signal provided by an external oscillation circuit (not shown).

Figure 9:
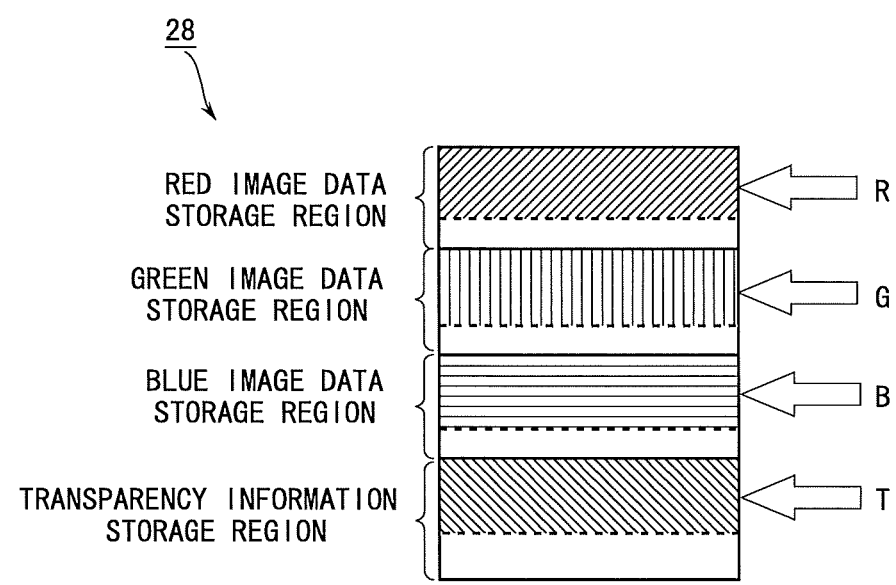
FIG. 9 is a diagram illustrating an internal configuration of frame memory included in the liquid crystal display device shown in FIG. 7.

FIG. 9 is a diagram illustrating an internal configuration of the frame memory 28. As shown in FIG. 9, the frame memory 28 is internally divided into storage regions for respectively storing the red image data R, the green image data G, the blue image data B, and the transparency information T, so that the image data R, G, and B for the respective colors and the transparency information T are stored in their respectively corresponding storage regions. Note that the image data R, G, and B for the respective colors will also be referred to collectively as the color image data.

The readout circuit 24b reads out the image data R, G, and 3 for the respective colors and the transparency information T from the predetermined storage regions of the frame memory 28, sequentially for each pixel at times determined by a memory clock signal (not shown). After the readout, the image data R, G, and B for the respective colors and the transparency information T are outputted to the output control circuit 25 in accordance with an LCD output clock signal LCDCK to be described later.

Furthermore, the input clock signal CK generated by the RGB conversion circuit 22 is provided to the output clock generation circuit 26 as well. The output clock generation circuit 26 generates the LCD output clock signal LCDCK and an LED output clock signal LEDCK in accordance with the input clock signal CK, and outputs the LCD output clock signal LCDCK to the readout circuit 24*b* provided in the frame memory control circuit 24, the output control circuit 25, and the LCD timing controller 30. Moreover, the LED output clock signal LEDCK is outputted to the LED timing controller 60.

The output control circuit 25 outputs the image data R, G, and B for the respective colors and the transparency information T, which have been read out from the frame memory 28, to the LCD timing controller 30 and the LED timing controller 60.

It should be noted that the signal processing portion 20 also includes the register 27. The register 27 provides various circuits included in the signal processing portion 20 with various programs and setting values for controlling the operation of the circuits. The register 27 is connected to an external personal computer via an unillustrated UART (universal asynchronous receiver-transmitter). Accordingly, the programs and setting values for controlling the circuit operation, which are stored in the register 27, can be rewritten by operating the external personal computer (not shown).

In accordance with the LCD output clock signal LCDCK outputted by the output clock generation circuit 26 as shown in FIG. 8, the LCD timing controller 30 generates a control signal SC1 for controlling the source driver 40, including a source start pulse signal, a source clock signal, a latch strobe signal, etc., and a control signal SC2 for controlling the gate driver 50, including a gate start pulse signal, a gate clock signal, etc. The control signal SC1 is outputted to the source driver 40, and the control signal SC2 is outputted to the gate driver 50.

Furthermore, in the case where the image data R, G, and B for the respective colors and the transparency information T are provided by the output control circuit 25, the LCD timing controller 30 outputs only the transparency information T to the source driver 40, whereas in the case where only the image data R, G, and B for the respective colors are provided, the image data R, G, and B for the respective colors are outputted to the source driver 40.

In the case where the control signal SC1 and the image data R, G, and B for the respective colors are provided, the source driver 40 generates data voltages on the basis of the image data R, G, and B, and applies the voltages to data signal lines SL on the liquid crystal display panel 90 to be described later. In accordance with the control signal SC2, the gate driver 50 generates scanning signals for activating scanning signal lines GL, and applies the generated signals to the scanning signal lines GL on the liquid crystal display panel 90 to be described later. As a result, the data voltages are written to liquid crystal capacitors Cp in pixel circuits 100, as will be described later.

Furthermore, in the case where the control signal SC1 and the transparency information T are provided, the source driver 40 generates a transparency voltage on the basis of the transparency information T, and applies the voltage simultaneously to a plurality of data signal lines SL. As a result, as in the case where the data voltages are written, the transparency voltage is written to liquid crystal capacitors Cp in pixel circuits 100, as will be described later.

The liquid crystal display panel 90 includes a plurality of data signal lines SL, a plurality of scanning signal lines GL, each crossing the data signal lines SL, and a plurality of pixel circuits 100 arranged in a matrix, each corresponding to one of the intersections of the data signal lines SL and the scanning signal lines GL. For the sake of convenience, FIG. 7 shows only one pixel circuit 100 being connected to one data signal line SL and one scanning signal line GL.

Each pixel circuit 100 includes a thin-film transistor (TFT) 101, which acts as a switching element with a gate terminal connected to its corresponding scanning signal line GL and a source terminal connected to its corresponding data signal line SL, a pixel electrode 102 connected to a drain terminal of the TFT 101, a common electrode 103 provided in common for the pixel circuits 100, and a liquid crystal layer (not shown) provided in common for the pixel circuits 100 between the pixel electrode 102 and the common electrode 103. The pixel electrode 102, the common electrode 103, and the liquid crystal layer provided therebetween constitute the liquid crystal capacitor Cp.

The data voltages outputted by the source driver 40 are applied simultaneously to the data signal lines SL formed on the liquid crystal display panel 90, and the scanning signals outputted by the gate driver 50 are applied sequentially to the scanning signal lines GL. In this manner, the scanning signal lines GL are sequentially activated one by one, thereby turning on TFTs 101 connected to the same scanning signal line GL, with the result that the data voltages applied to the data signal lines SL are written to the liquid crystal capacitors Cp via the TFTs 101 in ON state. In the case where the transparency voltage outputted by the source driver 40 is applied simultaneously to a plurality of data signal lines SL, the transparency voltage is similarly written to the liquid crystal capacitors Cp.

In the present invention, to perform field-sequential drive, it is necessary to use a liquid crystal display panel with a high-speed response ability, and therefore, the TFT 101 of each pixel circuit 100 preferably has a channel layer made with an oxide semiconductor so as to allow high-speed switching. Note that such a TFT 101 having a channel layer made with an oxide semiconductor will be described in detail later.

In the case where an image is displayed, the LED timing controller 60 generates a backlight control signal BSC for performing field-sequential drive on the backlight source 80, and provides the generated signal to the LED driver 70, on the basis of image data R, G, and B for the respective colors, which are provided by the output control circuit 25, and an LED output clock signal LEDCK provided by the output clock generation circuit 26. Moreover, in the case where see-through display is performed, the LED timing controller 60 is provided with image data R, G, and B for the respective colors and transparency information T from the output control circuit 25 as well as an LED output clock signal LEDCK from the output clock generation circuit 26. The LED timing controller 60 generates a backlight control signal BSC for turning off the backlight source 80 entirely at one time, and provides the generated signal to the LED driver 70, on the basis of the transparency information T and the LED output clock signal LEDCK. Note that the backlight control signal BSC will also be referred to as the light-emitting element control signal.

The backlight source 80 is a direct light source composed of red, green, and blue LEDs 80*r*, 80*g*, and 80*b* arranged regularly on a plane. In the case where an image is displayed, the LEDs 80*r*, 80*g*, and 80*b* are sequentially lit up in a time division manner. Moreover, in the case where the screen is rendered in a see-through state in whole or in part, thereby allowing a background to be viewed, the LEDs 80*r*, 80*g*, and 80*b* for the area to be seen through are turned off simultaneously.

Furthermore, in the case where a light guide plate is provided behind the liquid crystal display panel 90, the red, green, and blue LEDs 80*r*, 80*g*, and 80*b* may be arranged at an edge of the light guide plate. Light emitted by the LEDs

80r, 80g, and 80b for the respective colors is incident on the light guide plate from which the light illuminates the back of the liquid crystal display panel 90. In this case, no transparent area can be provided on a portion of the screen, but the entire screen can be rendered in a see-through state by turning off the LEDs 80r, 80g, and 80b for the respective colors.

In this manner, the liquid crystal display device can display an image by illuminating each pixel with backlight at a transmittance corresponding to a data voltage, or can increase the transmittance of the pixels and render the pixels in a see-through state by turning off the backlight source 80, such that the background can be viewed.

It should be noted that the liquid crystal display panel 90 described herein is of a normally white type but may be of a normally black type. Moreover, the LCD timing controller 30 will also be referred to as the image timing control portion, and the LED timing controller 60 will also be referred to as the light source timing control portion. Further, the source driver 40 and the gate driver 50 will also be referred to collectively as the driver circuits.

<1.3 Input Image Display>

Figure 10:
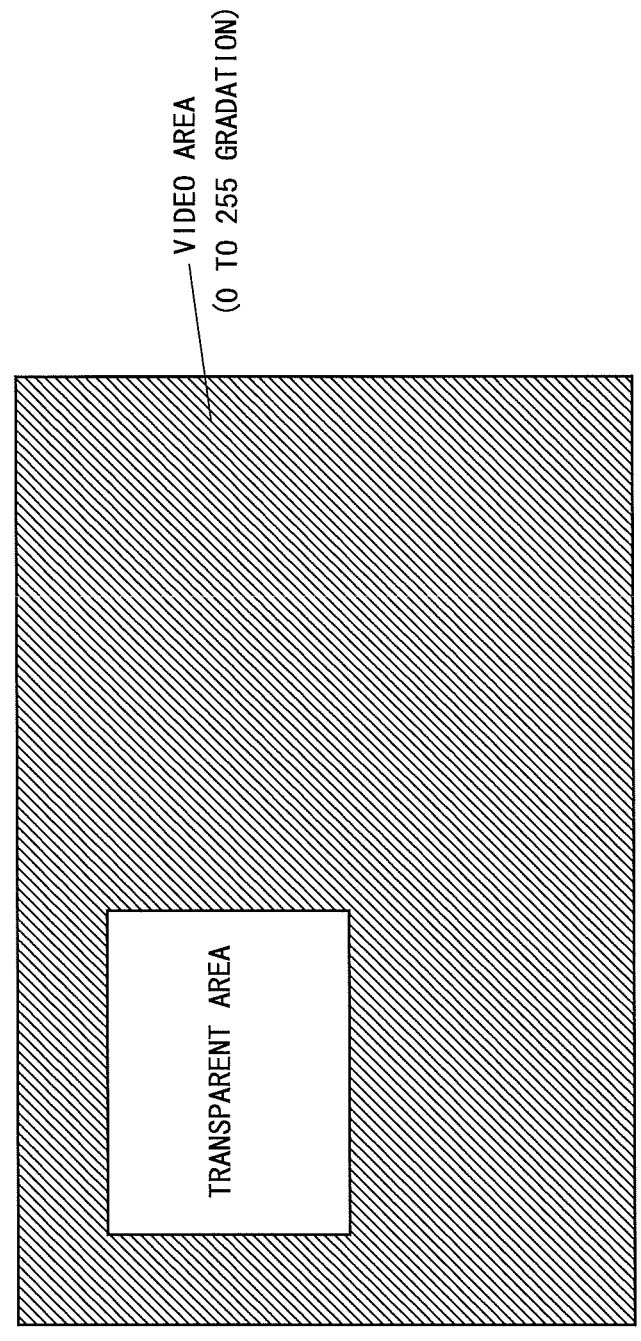
FIG. 10 is a diagram illustrating a screen displayed on a liquid crystal display panel shown in FIG. 7 on the basis of RGB image data, including transparency information for rendering a predetermined area transparent.

FIG. 10 is a diagram illustrating a screen displayed on the basis of RGB image data DV1, including transparency information T for rendering a predetermined area transparent. In some cases, when a color image is displayed on a screen, the screen is desired to be rendered partially transparent. In the present embodiment, to realize such a display state, the RGB image data DV1 is converted to YUV image data DV2 in YUV422 format, and chrominance information of the YUV image data DV2 is replaced by transparency information T. As a result, because there is no need to assign specific pixel values to the transparency information T, a color image can be displayed using colors determined by the RGB image data DV1, and a portion of the screen can be rendered in a see-through state, as shown in FIG. 10, so that the background can be viewed.

<1.4 Effects>

In the present embodiment, as is apparent from the foregoing, the RGB image data DV1 is converted to the YUV image data DV2 in YUV422 format, and the information about the color-difference components U and V in the YUV image data DV2 is replaced by the transparency information T. Thus, the liquid crystal display device can display a color image using all colors by means of field-sequential drive while achieving see-through display whereby the background can be viewed.

<1.5 Variants>

FIG. 11 is a table showing the configuration of a first variant of the transparency YUV image data DV3. In FIG. 4, for example, as for the second pixel, the color-difference component U, which is Cb1, is replaced by the transparency information T0, and the color-difference component V, which is Cr1, is replaced by the transparency information T1. However, in the first variant, both Cb1 and Cr1 are replaced by the transparency information T1, as shown in FIG. 11. Accordingly, as the transparency information T for the first and second pixels, either the transparency information T0, which is the replacement for Cb1, or the transparency information T1, which is the replacement for Cr1, is extracted by the information extraction circuit 21 in the signal processing portion 20, and the extracted transparency information is used as the transparency information T in subsequent processing. A similar procedure applies to the fourth and sixth pixels. Accordingly, for example, the first and second pixels can be controlled so as to be the same in terms of the state of being or not being transparent, using either the transparency information T0, which is the replacement for the chrominance Cb1, or the transparency information T1, which is the replacement for the chrominance Cr1.

FIG. 12 is a table showing the configuration of a second variant of the transparency YUV image data DV3. In the second variant, only Cb1 is replaced by the transparency information T1, as shown in FIG. 12. Accordingly, as the transparency information T for the first and second pixels, the transparency information T1, which is the replacement for Cb1, is extracted by the information extraction circuit 21 in the signal processing portion 20, and the extracted transparency information T1 is used as the transparency information T in subsequent processing. A similar procedure applies to the fourth and sixth pixels. In this case, for example, the transparency information T replaces only one of the two color-difference components, Cb1 and Cr1, and therefore, the transparency information T1 can be readily added or extracted.

2. Second Embodiment

<2.1 Image Data Format Conversion>

Format conversion performed by a liquid crystal display device according to a second embodiment of the present invention will be described. In the present embodiment, as in the first embodiment, externally inputted RGB image data is converted to YUV image data. Then, for every other pixel, transparency information T, which indicates whether the pixel is transparent, is added in place of color-difference components U and V, and for the second pixel, backlight information BL for providing control over turning on or off the backlight source is added. FIG. 13 is a table showing the configuration of transparency/backlight YUV image data resulting from the addition of the transparency information T and the backlight information BL. As shown in FIG. 13, for the second pixel, the color-difference component U, which is Cb0, is replaced by a combination of transparency information T0 and backlight information BL, and the color-difference component V, which is Cr0, is replaced by a combination of transparency information T1 and backlight information BL. However, for the fourth pixel, the color-difference component U, which is Cb2, and the color-difference component V, which is Cr2, are respectively replaced by transparency information T2 and transparency information T3, and for the sixth pixel, the color-difference component U, which is Cb4, and the color-difference component V, which is Cr4, are respectively replaced by transparency information T4 and transparency information T5. However, for the fourth and sixth pixels, unlike for the second pixel, no backlight information BL is added. In this manner, the transparency/backlight YUV image data is generated. By simply replacing the color-difference component U, which is Cb0, for the second pixel with the combination of transparency information T0 and backlight information BL and also the color-difference component V, which is Cr0, for the second pixel with the combination of transparency information T1 and backlight information BL, it is rendered possible to provide control over turning on or off all of the LEDs 80r, 80g, and 80b in the backlight source 80.

Next, the transparency information T and the backlight information BL are extracted from the transparency/backlight YUV image data. FIG. 14 is a diagram showing the configurations of the transparency information T and the backlight information BL extracted from the transparency/backlight YUV image data, along with the configuration of YUV image data after the extraction. As shown in FIG. 14, the pieces of transparency information T1 to T6 extracted from the transparency/backlight YUV image data are transparency information for the first through sixth pixels, respectively, and the backlight information BL is backlight information corresponding to all pixels of the liquid crystal display panel, rather than only the first through sixth pixels. Moreover, the transparency/backlight YUV image data remaining after the extraction of the pieces of transparency information T1 to T6 and the backlight information BL, is converted to the YUV image data. More specifically, for the first and second pixels, the color-difference component U becomes Cb0, and the color-difference component V becomes Cr0. Similarly, for the third and fourth pixels, the color-difference component U becomes Cb2, and the color-difference component V becomes Cr2; for the fifth and sixth, the color-difference component U becomes Cb4, and the color-difference component V becomes Cr4.

The transparency information T0 thus extracted from the transparency/backlight YUV image data for the first pixel render the first pixel in a transparent state. The transparency information T1 extracted from the transparency/backlight YUV image data for the second pixel render the second pixel in a transparent state. Similarly, the transparency information T4 extracted from the transparency/backlight YUV image data for the fifth pixel render the fifth pixel in a see-through state. The transparency information T4 extracted from the transparency/backlight YUV image data for the fifth pixel render the fifth pixel in a transparent state. The transparency information T5 extracted from the transparency/backlight YUV image data for the sixth pixel render the sixth pixel in a transparent state. As a result, all of the first through sixth pixels are rendered transparent, with the result that the viewer can see the background of the liquid crystal display device through these pixels.

Figure 15:
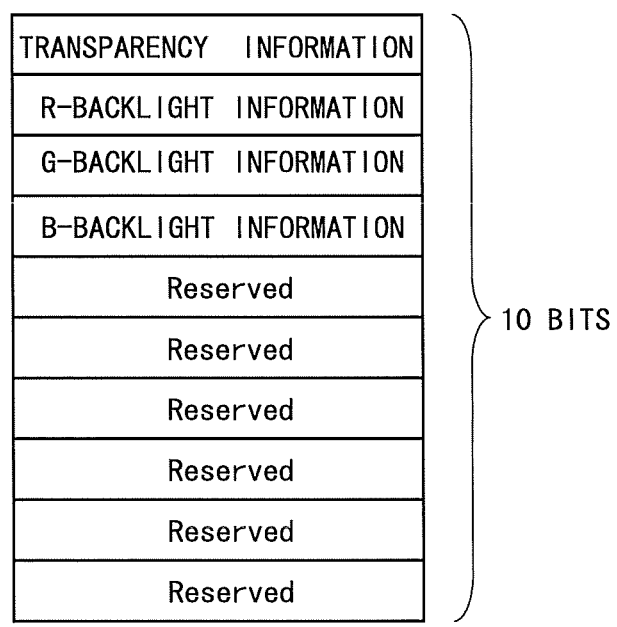
FIG. 15 is a diagram showing an example bit configuration of an additional information storage region provided for a color-difference component for a pixel in the transparency/backlight YUV image data shown in FIG. 13.

Furthermore, as in the case of the YUV image data described in the first embodiment, the YUV image data in the present embodiment has a 10-bit additional information storage region provided on a pixel by pixel basis for each of the luminance Y and the color-difference components U and V in order to store additional information. Stored in the additional information storage region are not only the transparency information T, which is 1-bit information, but also the backlight information BL, which consists of a total of three bits respectively for the red, green, and blue LEDs included in the backlight source, for use in providing control over turning on or off the red, green, and blue LEDs. FIG. 15 is a diagram showing an example bit configuration of the additional information storage region provided for the color-difference component U for a pixel. As shown in FIG. 15, the additional information storage region provided for the color-difference component U for the pixel, for which the transparency information T and the backlight information BL are added, consists of ten bits, one of which being used to store the transparency information T, three of which being used to store the backlight information BL, and the remaining six bits being reserved for backups.

<2.2 Configuration and Operation of the Liquid Crystal Display Device>

Figure 16:
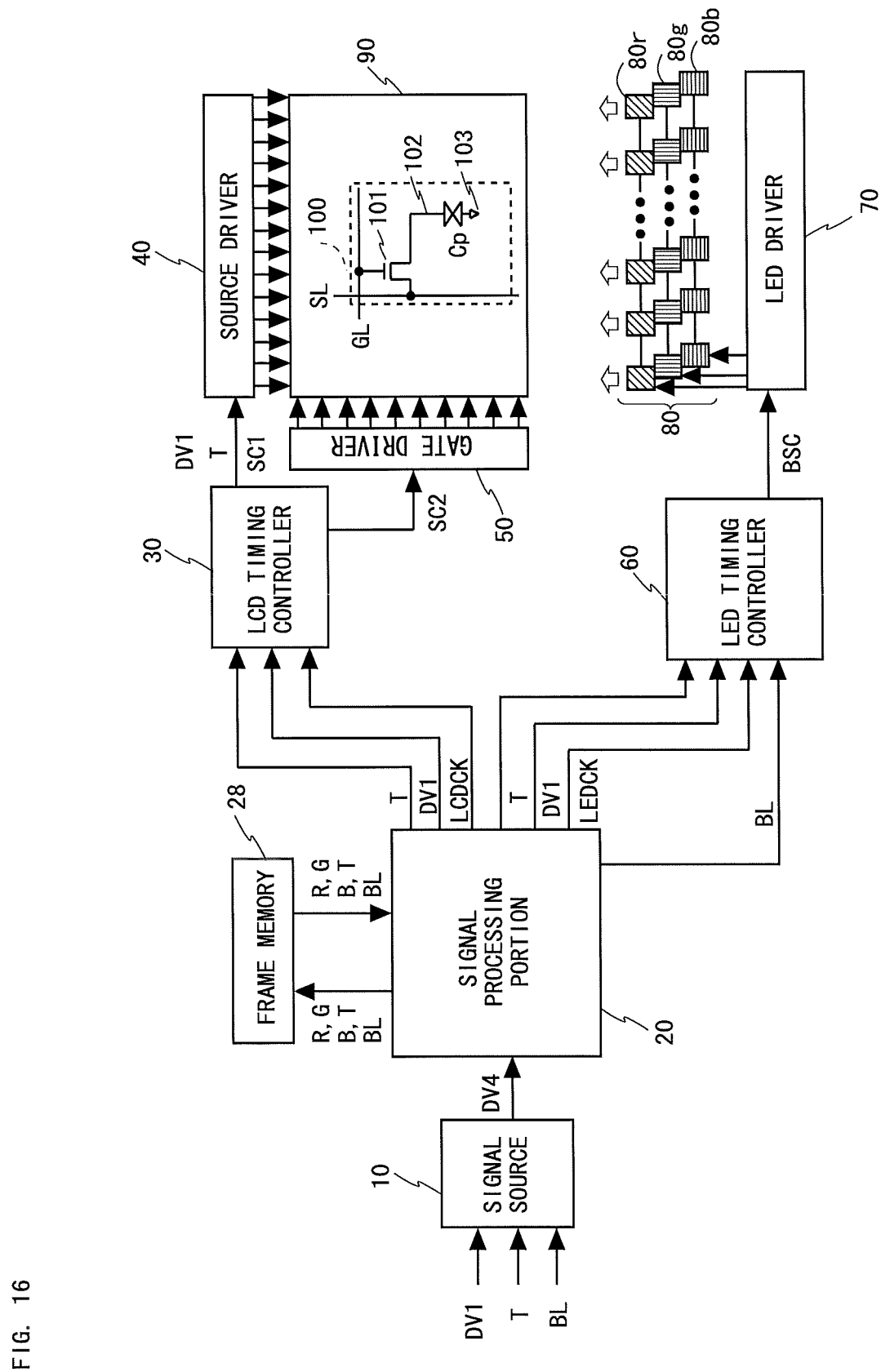
FIG. 16 is a block diagram illustrating the configuration of a liquid crystal display device according to the second embodiment of the present invention.
Figure 17:
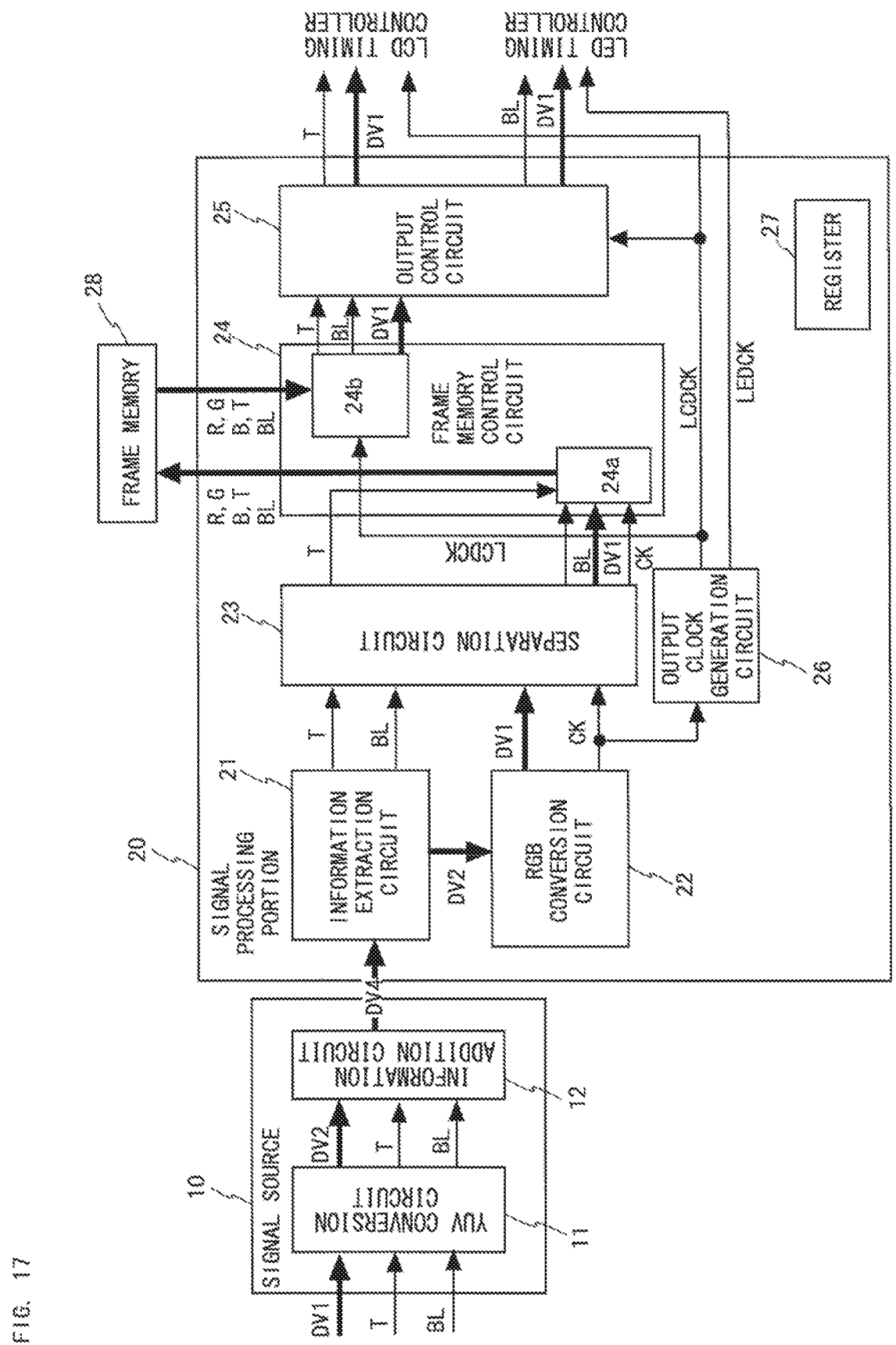
FIG. 17 is a block diagram illustrating in detail the configurations of a signal source and a signal processing portion included in the liquid crystal display device shown in FIG. 16.

FIG. 16 is a block diagram illustrating the configuration of the liquid crystal display device according to the present embodiment, and FIG. 17 is a block diagram illustrating in detail the configurations of the signal source 10 and the signal processing portion included in the liquid crystal display device shown in FIG. 16. The block diagrams in FIGS. 16 and 17 are the same as those shown in FIGS. 7 and 8, respectively, except that the backlight information BL is added. Therefore, the elements included in FIGS. 16 and 17 are denoted by the same reference characters as their corresponding elements included in FIGS. 7 and 8, any descriptions thereof will be omitted, and the elements related to the processing of the backlight information BL will be mainly described.

In the present embodiment, as shown in FIG. 17, when the backlight information BL, along with the RGB image data DV1 and the transparency information T, is externally provided to the YUV conversion circuit 11 in the signal source 10, the YUV conversion circuit 11 converts the RGB image data DV1 to the YUV image data DV2 in YUV422 format, and outputs the YUV image data DV2 to the information addition circuit 12, along with the transparency information T and the backlight information BL. The information addition circuit 12 adds the transparency information T and the backlight information BL to the information about the color-difference components U and V in the YUV image data DV2 for the second pixel and also the transparency information T to the information about the color-difference components U and V for the fourth and sixth pixels, thereby generating the transparency/backlight YUV image data DV4 (see FIG. 13), and outputs the generated data to the signal processing portion 20.

The transparency/backlight YUV image data DV4 is provided to the information extraction circuit 21 in the signal processing portion 20. The information extraction circuit 21 extracts the transparency information T and the backlight information BL, which have been added, from the transparency/backlight YUV image data DV4, and outputs the transparency information T and the backlight information BL to the separation circuit 23, and the YUV image data DV2, which remains after the extraction of the transparency information T and the backlight information BL, to the RGB conversion circuit 22.

The separation circuit 23 separates the RGB image data DV1 provided by the RGB conversion circuit 22 into red image data R, green image data G, and blue image data B, and outputs these data to the frame memory control circuit 24, along with the transparency information T, the backlight information BL, and an input clock signal CK.

Figure 18:
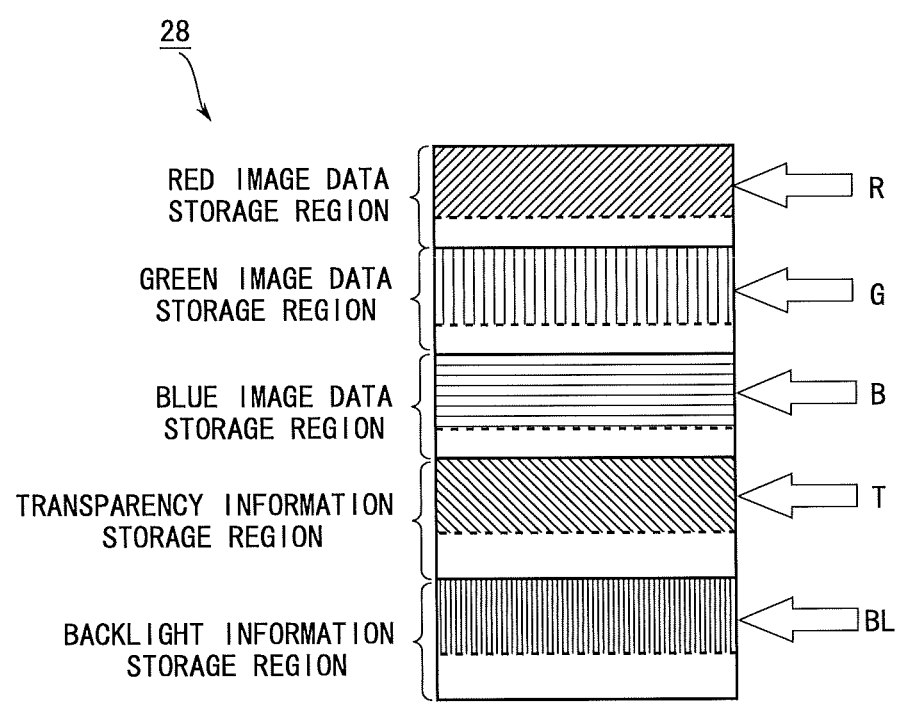
FIG. 18 is a diagram illustrating an internal configuration of frame memory included in the liquid crystal display device shown in FIG. 16.

The write circuit 24a in the frame memory control circuit 24 writes the image data R, G, and B for the respective colors, the transparency information T, and the backlight information BL to the frame memory 28 upon provision, in accordance with the input clock signal CK. FIG. 18 is a diagram illustrating an internal configuration of the frame memory 28. As shown in FIG. 18, the frame memory 28 is internally divided into storage regions for storing the red image data R, the green image data G, the blue image data B, the transparency information T, and the backlight information BL, and the image data R, G, and B for the respective colors, the transparency information T, and the backlight information BL are stored in their corresponding storage regions.

The readout circuit 24b reads out the image data R, G, and B for the respective colors, the transparency information T, and the backlight information BL from the predetermined storage regions of the frame memory 28, sequentially for each pixel at times determined by a memory clock signal (not shown). Then, in accordance with an LCD output clock signal LCDCK, the image data R, G, and B for the respective colors, the transparency information T, and the backlight information BL, which have been read out, are outputted to the output clock generation circuit 26.

The output clock generation circuit 26 outputs the image data R, G, and B for the respective colors and the transparency information T to the LCD timing controller 30, and also the image data R, G, and B for the respective colors and the backlight information BL to the LED timing controller 60. The processing by the LCD timing controller 30 and the LED timing controller 60, and subsequent processing are the same as in the first embodiment, and therefore, any descriptions thereof will be omitted. As a result of the above, the liquid crystal display panel 90 of the liquid crystal display device can be rendered in a see-through state to allow the background to be seen therethrough and also can display an image.

<2.2 Effects>

As is apparent from the foregoing, the present embodiment, as with the first embodiment, allows the liquid crystal display device to display a color image using all colors by means of field-sequential drive while achieving see-through display whereby the background can be viewed.

<2.3 Variants>

The backlight information BL required for turning on or off each of the red LED 80*r*, the green LED 80*g*, and the blue LED 80*b* has been described as being composed of one bit. However, by representing light emission information about each of the LEDs 80*r*, 80*g*, and 80*b* for the respective colors by three bits, it is rendered possible to control screen brightness in a see-through state. As a result, a wide variety of representations can be rendered possible by causing the LEDs 80*r*, 80*g*, and 80*b* for the respective colors to simultaneously emit light in a see-through state.

Figure 19:
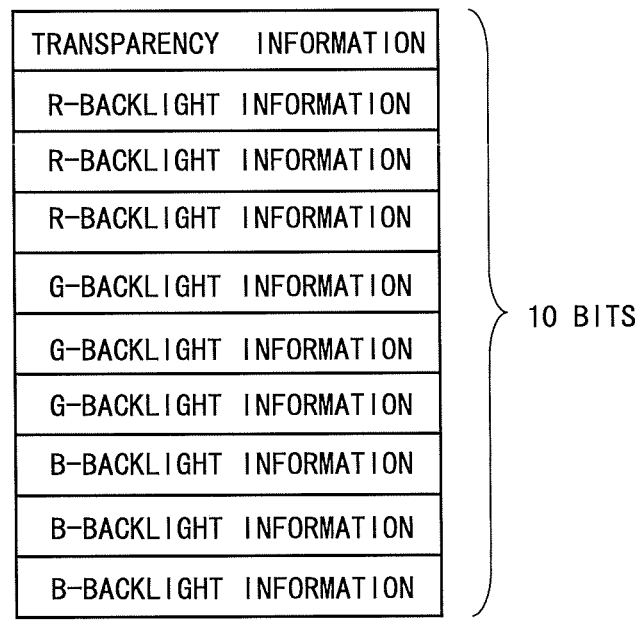
FIG. 19 is a diagram showing an example bit configuration of an additional information storage region provided for a color-difference component for a pixel in transparency/backlight YUV image data in a first variant of the second embodiment.

FIG. 19 is a diagram showing an example bit configuration where the color-difference component U for the pixel is replaced by a combination of transparency information T and backlight information BL that controls each color level by three bits. As shown in FIG. 19, instead of data for the color-difference component U, data for the transparency information T is stored as the first bit, and further, red backlight information, green backlight information, and blue backlight information, each of which is composed of three bits, are stored in this order.

3. Third Embodiment

<3.1 Image Data Format Conversion>

Format conversion performed by a liquid crystal display device according to a third embodiment of the present invention will be described. In the present embodiment, as in the second embodiment, externally inputted RGB image data is converted to YUV image data, and transparency information T, which indicates the state of being or not being transparent, and backlight information BL for providing control over turning on or off the backlight source are added to the YUV image data.

In the present embodiment, unlike in the second embodiment, field-sequential drive uses white fields in which the red, green, and blue LEDs 80*r*, 80*g*, and 80*b* are lit up simultaneously, in addition to red fields in which the red LEDs 80*r* are lit up, green fields in which the green LEDs 80*g* are lit up, and blue fields in which the blue LEDs 80*b* are lit up.

Figure 20:
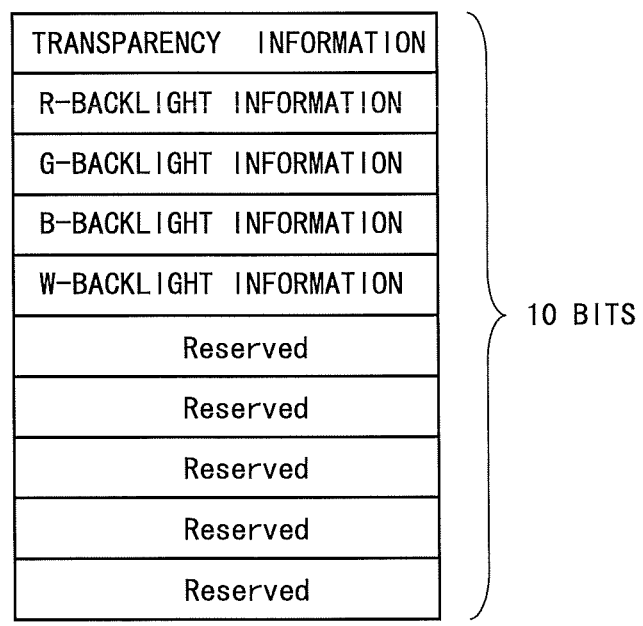
FIG. 20 is an example bit configuration of an additional information storage region provided for a color-difference component for a pixel in transparency/backlight YUV image data for a liquid crystal display device according to the third embodiment of the present invention.

FIG. 20 is an example bit configuration of the additional information storage region for the second pixel where the transparency information T and the backlight information BL are added in place of the color-difference component U. As shown in FIG. 20, for the second pixel, one of the ten bits of data stored for the color-difference component U is used for storing data for the transparency information T, and the following three bits are used for the backlight information BL for providing control over turning on or off the LEDs 80*r*, 80*g*, and 80*b*, the three bits respectively corresponding to red image data R, green image data G, and blue image data B. Moreover, to support white image data W, one bit of backlight information BL for simultaneously turning on or off the LEDs 80*r*, 80*g*, and 80*b* is stored, and the remaining five bits are reserved for backups. Further, the above applies similarly to the ten bits of data stored for the color-difference component U. Note that for the fourth and sixth pixels, no backlight information BL is added, and therefore, only the transparency information T is stored, as in the case of the bit configuration shown in FIG. 6. Subsequent processing of transparency/backlight YUV image data DV4 resulting from addition of the transparency information T and the backlight information BL is the same as in the second embodiment, and therefore, any description thereof will be omitted.

<3.2 Configuration and Operation of the Liquid Crystal Display Device>

The configuration of the liquid crystal display device according to the third embodiment of the present invention and the details of the configurations of the signal source and the signal processing portion included in the liquid crystal display device according to the present embodiment are respectively the same as in the block diagrams shown in FIGS. 7 and 8, and therefore, any block diagrams and descriptions thereof will be omitted.

Furthermore, in the present embodiment, for the first through sixth pixels, the information about the luminances and the color-difference components in the transparency/backlight YUV image data DV4 resulting from addition of the transparency information T and the backlight information BL is represented by the same diagram as in FIG. 13, and therefore, any diagram and description thereof will be omitted.

<3.3 Effects>

As is apparent from the foregoing, the present embodiment, as with the first embodiment, allows the liquid crystal display device to display a color image using all colors by means of field-sequential drive while achieving see-through display whereby the background can be viewed. Moreover, the white field is added, with the result that the occurrence of color breakup can be inhibited.

4. Fourth Embodiment

<4.1 Image Data Format Conversion>

Format conversion performed by an organic EL (electroluminescent) display device according to a fourth embodiment of the present invention will be described. In the present embodiment, externally inputted RGB image data is converted to YUV image data in YUV422 format, as in the case of the format conversion described in conjunction with the liquid crystal display device according to the second embodiment. Then, transparency information T, which indicates the state of being or not being transparent, and element light emission information ES for controlling light emission of organic EL light-emitting elements, which collectively correspond to the backlight source, are added to the YUV image data, thereby generating transparency/backlight YUV image data. Thereafter, the transparency information T and the element light emission information ES are extracted from the transparency/backlight YUV image data, and the YUV image data remaining after the extraction is converted to RGB image data. On the basis of the RGB image data thus generated, the transparency information T, and the element light emission information ES, the organic EL display device displays an image and is rendered in a see-through state whereby the background can be viewed.

<4.2 Configuration and Operation of the Organic EL Display Device>

Figure 21:
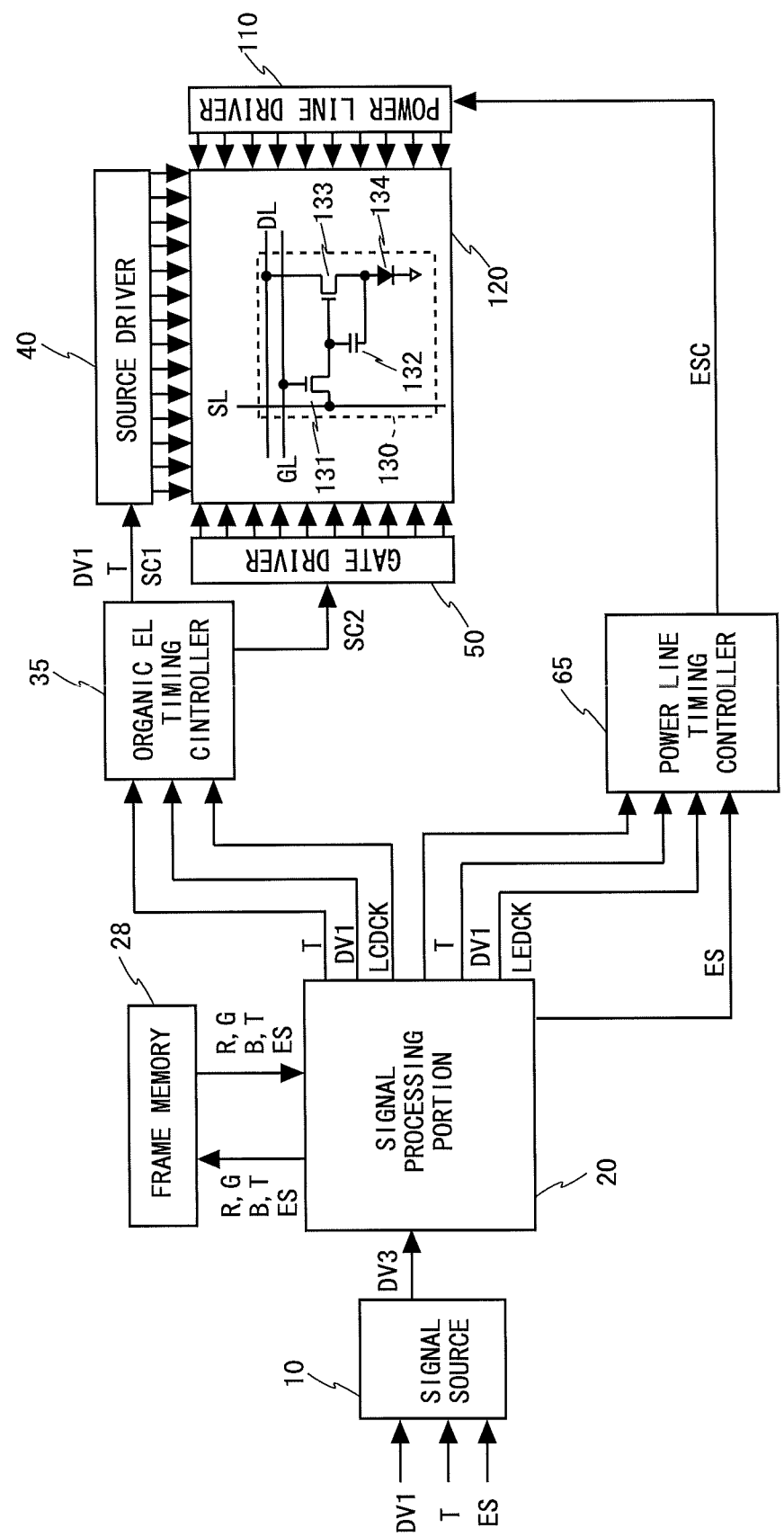
FIG. 21 is a block diagram illustrating the configuration of an organic EL display device according to a fourth embodiment of the present invention.

FIG. 21 is a block diagram illustrating the configuration of the organic EL display device according to the present embodiment. As shown in FIG. 21, the organic EL display device displays an image by causing an organic EL light-emitting element 134 included in each pixel circuit 130 to emit light, or is rendered in a see-through state by not turning on the organic EL light-emitting elements 134, and therefore, unlike in the case of the liquid crystal display device shown in FIG. 16, no backlight source 80 is provided. Accordingly, elements different from the elements of the liquid crystal display device described in the first embodiment will be mainly described below, while the same elements are denoted by the same reference characters, and any descriptions thereof will be omitted.

In the case of the organic EL display device, the element light emission information ES for controlling light emission of the organic EL light-emitting element 134 is inputted in place of the backlight information BL, which is inputted in the case of the liquid crystal display device. However, the element light emission information ES is processed by the signal source 10 and the signal processing portion 20 in the same manner as the backlight information BL is processed by the signal source 10 and the signal processing portion 20 of the liquid crystal display device, and therefore, any description about the processing will be omitted.

The organic EL display device includes an organic EL timing controller 35, which is provided in place of the LCD timing controller 30, and a power line timing controller 65, which is provided in place of the LED timing controller 60. As will be described in detail later, the organic EL timing controller 35 and the power line timing controller 65 have the same functions as the LCD timing controller 30 and the LED timing controller 60, respectively.

The organic EL display device uses an organic EL panel 120 instead of the liquid crystal display panel 90. The organic EL panel 120 includes a plurality of data signal lines SL, a plurality of scanning signal lines GL, each crossing the data signal lines SL, a plurality of power lines DL arranged in parallel to the scanning signal lines, and pixel circuits 130 arranged in a matrix so as to correspond to their respective intersections of the data signal lines SL and the scanning signal lines GL.

The pixel circuit 130 includes a thin-film transistor (TFT) 131, which functions as a switching element, a thin-film transistor (TFT) 133, which operates as a drive element for driving the organic EL light-emitting element 134, the organic EL light-emitting element 134, which functions as a light-emitting element, and a capacitor 132, which operates as a capacitive element for holding signal charge based on RGB image data DV1.

The TFT 131 has a gate terminal connected to the scanning signal line GL, a drain terminal connected to the data signal line SL, and a source terminal connected to a connection point between a gate terminal of the TFT 133 and the capacitor 132. The TFT 133 has a drain terminal connected to the power line DL and a source terminal connected to the other end of the capacitor and an anode of the organic EL light-emitting element 134. The organic EL light-emitting element 134 has a cathode fixed at a ground potential.

To allow background light to be transmitted through at least a portion of the pixel circuit 130, at least some of the electrode layers and wiring layers of the TFTs 131 and 133 and the capacitor 132 are formed with a transparent material. Accordingly, when transparency information T is externally provided, background light transmission increases, with the result that the viewer can see the background through the pixel circuits 130.

In the case of such a pixel circuit 130, once the TFT 131 is turned on by activating the scanning signal line GL, a data voltage in accordance with RGB image data DV1 is written and held in the capacitor 132 through the data signal line SL by way of the TFT 131. The data voltage being held in the capacitor 132 is applied to the TFT 133 as a gate voltage, whereby the TFT 133 is turned on. Moreover, a power line driver 110 generates a power voltage at a predetermined value in accordance with a power line control signal ESC provided by the power line timing controller 65, and applies the generated voltage to the power line DL. As a result, a current flows from the power line DL through the TFT 133 to the organic EL light-emitting element 134. The current flowing through the organic EL light-emitting element 134 varies in value depending on the gate voltage being applied to the TFT 133, and the organic EL light-emitting element 134 emits light with a luminance corresponding to the value of the current. Thus, the organic EL panel 120 displays an image in conformity with the RGB image data DV1.

Furthermore, when transparency information T is provided from the LCD timing controller 30 to the source driver 40, the source driver 40 generates a transparency voltage having a value of 0V, on the basis of the transparency information T, and applies the generated voltage to the data signal line SL. Moreover, the power line driver 110 generates a power voltage having a value of 0V in accordance with a power line control signal ESC provided by the power line timing controller 65, and applies the generated voltage to the power line DL. As a result, the TFT 133 is turned off, so that the organic EL light-emitting element 134 emits no light. In this manner, the pixel circuits 130 are rendered in a see-through state, with the result that the viewer can see the background.

It should be noted that the TFTs 131 and 133 preferably have their channel layers formed with an oxide semiconductor, so as to achieve high-speed switching as can be achieved by the TFT 101. Accordingly, such TFTs with channel layers formed with an oxide semiconductor will be described in detail later. Moreover, the pixel circuit 130 consisting of the two TFTs 131 and 133 and the capacitor 132, as shown in FIG. 21, is illustrative only, and another configuration may be employed. Further, the backlight information BL described in the first through third embodiments and the element light emission information ES in the present embodiment will also be referred to collectively as the "light source information". In addition, the organic EL timing controller 35 and the power line timing controller 65 will also be referred to as the "image timing control portion" and the "light source timing control portion", respectively.

5. TFT in the Pixel Circuit

The TFT 101 included in the pixel circuit 100 of the liquid crystal display device according to each of the embodiments of the present invention will now be described. The TFT 101 is a TFT having an oxide semiconductor layer as a channel layer. The oxide semiconductor layer may contain, for example, at least one of the following metallic elements: In, Ga, and Zn. The oxide semiconductor layer includes, for example, an In—Ga—Zn—O based semiconductor (e.g., indium gallium zinc oxide). The In—Ga—Zn—O based semiconductor is a ternary oxide composed of In (indium), Ga (gallium), and Zn (zinc). The ratio (composition ratio) of In, Ga, and Zn is not specifically limited, and may be such that, for example. In:Ga:Zn–2:2:1, In:Ga:Zn–1:1:1, or In:Ga:Zn–1:1:2. The oxide semiconductor layer is formed using an oxide semiconductor film containing an In—Ga—Zn—O based semiconductor. The In—Ga—Zn—O based semiconductor may be amorphous or crystalline. The crystalline In—Ga—Zn—O based semiconductor preferably has the c-axis oriented approximately vertical to the layer surface.

TFTs with In—Ga—Zn—O based semiconductor layers offer high mobility (more than 20 times as high as a-Si TFTs) and low leakage current (less than 1/100 of that of a-Si TFTs). Accordingly, such an In—Ga—Zn—O based semiconductor layer is preferably used as the channel layer of the TFT 101, which is used as a switching element in the pixel circuit 100 of the liquid crystal display panel 90 to be driven at high-speed as in the case of field-sequential drive. Note that the foregoing has been directed to the liquid crystal display device, but the same applies to the TFTs 131 and 133 included in the pixel circuit 130 of the organic EL display device.

This application claims priority to Japanese Patent Application No. 2015-219265, filed Nov. 9, 2015 and titled "Display Device", the content of which is incorporated herein by reference.

INDUSTRIAL APPLICABILITY

The present invention is applied to display devices capable of displaying a color image using all colors by means of field-sequential drive while achieving see-through display whereby the background can be viewed.

DESCRIPTION OF THE REFERENCE CHARACTERS

10 signal source
11 YUV conversion circuit
12 information addition circuit
21 information extraction circuit
22 RGB conversion circuit
23 separation circuit
24 frame memory control circuit
25 output control circuit
26 output clock generation circuit
30 LCD timing controller (image timing control portion)
35 organic EL timing controller (image timing control portion)
40 source driver (driver circuit)
50 gate driver (driver circuit)
60 LED timing controller (light source timing control portion)
65 power line timing controller (light source timing control portion)
70 LED driver
80 backlight source
80*r*, 809, 80*b* red, green, and blue LEDs
90 liquid crystal display panel (display panel)
120 organic EL panel (display panel)
100, 130 pixel circuit
101, 131, 133 TFT

The invention claimed is:

1. A display device for displaying a color image by separating a frame consisting of a plurality of fields into the individual fields and displaying an image in a different color for each field, the device comprising:
a display panel including a plurality of pixel circuits capable of display in a transparent display mode, the pixel circuits being arranged in a matrix;
a driver circuit configured to drive the pixel circuits;
an image timing control portion configured to control a time to output a plurality of pieces of color image data included in input image data in an RGB format to the driver circuit, each piece of the color image data representing an image in a different color;
a signal source configured to convert externally provided input image data to YUV image data in YUV422 format and, when transparency information by which the display panel is caused to be transparent, is inputted as well, generate transparency YUV image data by adding the transparency information to information about color-difference components in the YUV image data; and
a signal processing portion configured to, when the transparency information is added, extract the transparency information from the transparency YUV image data and convert the YUV image data remaining after the extraction of the transparency information to RGB image data in the RGB format, or when the transparency information is not added, convert the YUV image data to image data in the RGB format and output both the transparency information and the RGB image data, or only the RGB image data, to the image timing control portion on a field by field basis, wherein,
the image timing control portion, when provided with the transparency information and the RGB image data, causes the display panel to be transparent so as to transmit background light, on the basis of the transparency information, or when provided with only the RGB image data, displays an image.

2. The display device according to claim 1, wherein the transparency information is added to information about two color-difference components in the YUV image data for every other pixel, such that the transparency information added for a first of the two color-difference components and the transparency information added for a second of the two color-difference components are respectively for different pixels.

3. The display device according to claim 2, wherein the transparency information added for the first color-difference component and the transparency information added for the second color-difference component are different information.

4. The display device according to claim 2, wherein the transparency information added for the first color-difference component and the transparency information added for the second color-difference component are identical information.

5. The display device according to claim 1, wherein the transparency information is added to information about only one of two color-difference components in the YUV image data for every other pixel, such that the transparency information added for the color-difference component is related to different pixels.

6. The display device according to claim 1, wherein,
the display panel is a liquid crystal display panel,
the display device further comprises:
a backlight source disposed on a back of the liquid crystal display panel and including a plurality of light-emitting elements irradiating the liquid crystal display panel with light in a color corresponding to color image data included in the input image data for each of the fields; and a light source timing control portion configured to, when light source information is externally inputted or internally generated, generate and output a light-emitting element control signal to the backlight source in order to provide control over turning on or off the light-emitting elements in accordance with the light source information, and the light source timing control portion, when the input image data is externally provided, irradiates the liquid crystal display panel with backlight in a plurality of colors outputted by the backlight source in a time division manner, or when the transparency information is inputted along with the input image data, turns off the light-emitting elements.

7. The display device according to claim 6, wherein the light-emitting elements of the backlight source are arranged on a plane.

8. The display device according to claim 6, wherein the light source information is provided only for first pixels in the input image data that have been provided with the transparency information.

9. The display device according to claim 6, wherein the light source information is information represented by a plurality of bits for each color of light to be emitted, and causes the light-emitting elements to emit light simultaneously for display in the transparent display mode.

10. The display device according to claim 6, wherein,
when the light source information is externally inputted along with the input image data, the signal source generates transparency/backlight YUV image data by further adding the light source information to the YUV image data in order to control the light-emitting elements, and the signal processing portion extracts the light source information from the transparency/backlight YUV image data, along with the transparency information, converts the YUV image data remaining after the extraction of the transparency information and the light source information, to the RGB image data, and outputs the light source information and the RGB image data to the image timing control portion.

11. The display device according to claim 10, wherein the signal processing portion further generates light source information for a white field provided to simultaneously light up all of the light-emitting elements, in addition to color image data corresponding to the white field, and outputs the light source information to the light source timing control portion and the color image data to the image timing control portion.

12. The display device according to claim 1, wherein,
the display panel is an organic EL panel on which a plurality of pixel circuits are disposed, each pixel circuit including a light-emitting element irradiating the organic EL panel with light in a color corresponding to color image data included in the input image data for each of the fields, the display device further comprises a light source timing control portion configured to, when light source information is externally inputted or internally generated, generate and output a light-emitting element control signal to the organic EL panel in order to provide control over turning on or off the light-emitting elements in accordance with the light source information, and the light source timing control portion, when the input image data is externally provided, causes the light-emitting elements to emit light sequentially in colors corresponding to the color image data in a time division manner, in accordance with the light-emitting element control signal, or when the transparency information is inputted along with the input image data, turns off the light-emitting elements.

13. The display device according to claim 1, wherein the pixel circuit includes a thin-film transistor with an oxide semiconductor layer.

14. The display device according to claim 13, wherein the oxide semiconductor layer is formed with indium gallium zinc oxide.

* * * * *